United States Patent
Chilcote et al.

(10) Patent No.: US 7,279,891 B1
(45) Date of Patent: Oct. 9, 2007

(54) PERMALLOY BRIDGE WITH SELECTABLE WAFER-ANISTROPY USING MULTIPLE LAYERS

(75) Inventors: Jason M. Chilcote, Frisco, TX (US); Perry A. Holman, Garland, TX (US); Larry A. Rehn, Richardson, TX (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 11/453,533

(22) Filed: Jun. 15, 2006

(51) Int. Cl.
*G01R 33/02* (2006.01)

(52) U.S. Cl. .................. 324/252; 324/207.21
(58) Field of Classification Search ............... 324/252, 324/207.21
See application file for complete search history.

(56) References Cited

U.S. PATENT DOCUMENTS

| | | | |
|---|---|---|---|
| 6,717,789 B2 | 4/2004 | Holman et al. | 361/111 |
| 6,727,689 B1 | 4/2004 | Furlong et al. | 324/207.25 |
| 7,005,915 B2 | 2/2006 | Kilian et al. | 330/6 |
| 7,005,958 B2 * | 2/2006 | Wan | 338/32 R |
| 2005/0088175 A1 | 4/2005 | Chilcote et al. | 324/252 |
| 2005/0189988 A1 | 9/2005 | Killian et al. | 330/6 |

* cited by examiner

*Primary Examiner*—Reena Aurora
(74) *Attorney, Agent, or Firm*—Kermit D. Lopez; Luis M. Ortiz

(57) ABSTRACT

A magnetic sensing method and apparatus include a plurality of bridge circuits, wherein each bridge circuit or element within a bridge is formed on a separate permalloy layer comprising a plurality of permalloy bridge runners. The permalloy bridge runners can be selected such that each permalloy bridge runner possesses a selectable wafer anisotropy to a length of the permalloy bridge runner in order to form a magnetic sensor based on the bridge circuits, maximize the magnetic sensitivity of the magnetic sensor, maximize the matching between bridges and independently control the wafer anisotropy through the use of multiple bridge circuits configured on separate permalloy layers.

20 Claims, 4 Drawing Sheets

PERMALLOY BRIDGE WITH SELECTABLE WAFER-ANISTROPY USING MULTIPLE LAYERS

TECHNICAL FIELD

Embodiments are generally related to magnetic sensors. Embodiments are also related to magnetoresistive materials and magnetoresistive-based sensors. Embodiments are additionally related to permalloy materials and magnetic sensors which incorporate such permalloy materials.

BACKGROUND

Magnetoresistors are often utilized for the contactless detection of changes in state, such as the measurement of an angular position of a rotatably mounted part. Magnetoresistive-based sensors typically include magnetic field-dependent resistors, which are arranged in a bridge circuit configuration and through which a control current is fed. When a magnetoresistive-based sensor is influenced by a magnetic field, a voltage can be established in which the magnitude of the voltage depends on the magnitude and direction of the magnetic field associated with the sensor.

The relationship between an associated bridge circuit voltage and the magnetic field direction can be utilized in a contactless magnetoresistive sensor, for example, to detect the angular position of a rotatably mounted part. Such sensors are particularly useful in automotive applications. Magnetoresistive sensors are typically configured from a magnetoresistive film that is formed from a magnetic substance that exhibits a magnetoresistive effect and generally possesses a single active layered structure.

Magnetic sensors can be formed based on permalloy material. One example of such a magnetic sensor is disclosed in U.S. Patent Application Publication No. US2005/0088175A1, entitled "Permalloy Magnetization Reversal Sensor," by Jason M. Chilcote, et al., which published on Apr. 28, 2005. U.S. Patent Application Publication No. US2005/0088175A1 is incorporated herein by reference in its entirety.

A magnetoresistive sensor may be acted upon by a magnetic field oriented in a particular manner, such that a definite control current can be applied to the current contacts of an associated bridge circuit. The voltage that is then established at the other contacts can be measured on an ongoing basis. In general, the serpentine pattern of magnetoresistive material utilized in magnetoresistive sensors can be connected electrically in a Wheatstone bridge arrangement in order to sense changes in the resistance of the magnetoresistive material in response to changes in the strength and direction of a magnetic field component in the plane of the magnetoresistive elements. In order to monitor the changes in the resistance of the material, associated components, such as amplifiers, are generally connected together to form an electrical circuit, which provides an output signal that is representative of the strength and direction of the magnetic field in the plane of the sensing elements.

When the circuit is provided on a silicon substrate, for example, electrical connections between associated components can be made above the surface of the silicon or by appropriately doped regions beneath the components and within the body of the silicon substrate. Components can be connected to each other above the surface of the silicon by disposing conductive material to form electrically conductive paths between the components. When appropriately doped regions within the silicon substrate connect components in electrical communication with each other, an electrically conductive path can be formed by diffusing a region of the silicon with an appropriate impurity, such as phosphorous, arsenic or boron to form electrically conductive connections between the components.

Based on the foregoing it can be appreciated that there is generally a need and desire for the design and implementation of highly sensitive magnetic sensors. Prior art magnetic sensing devices have been limited in the range and offering of device sensitivity. There are also requirements for lower power consumption and smaller sensor sizes, which are not provided by prior configurations. It is therefore believed that a continuing need exists for magnetic sensing devices having improved sensitivity, power offerings, and decreased magnetic sensor size offerings that utilize permalloy thin films.

BRIEF SUMMARY

The following summary is provided to facilitate an understanding of some of the innovative features unique to the embodiments and is not intended to be a full description. A full appreciation of the various aspects of the embodiments disclosed can be gained by taking the entire specification, claims, drawings, and abstract as a whole.

It is, therefore, one aspect of the present invention to provide for an improved magnetic sensor It is yet another aspect of the present invention to provide for an improved magnetic sensor having a permalloy bridge with selectable wafer anisotropy utilizing multiple permalloy layers.

The aforementioned aspects of the invention and other objectives and advantages can now be achieved as described herein. A magnetic sensing method and apparatus are disclosed. In general, a plurality of bridge circuits can be provided, wherein each bridge circuit among the plurality of bridge circuits is formed on a separate permalloy layer comprising a plurality of permalloy bridge runners. The permalloy bridge runners can be selected such that each permalloy bridge runner possesses a wafer anisotropy perpendicular or any selectable angle to a length of the permalloy bridge runner in order to form a magnetic sensor based on the bridge circuits, maximize the magnetic sensitivity of the magnetic sensor, and independently control the wafer anisotropy through the use of multiple bridge circuits configured on separate permalloy layers.

Additionally, the bridge circuits can be arranged as concentric bridge circuits. The permalloy bridge runners can be configured to possess said wafer anisotropy at, for example, but not limited to a 45-degree angle thereof to provide enhanced matching capabilities between the bridge circuits. Each bridge circuit can be provided as a Wheatstone bridge circuit.

By constructing bridges in two or more layers of permalloy, these improvements can be further utilized. Bridges with perpendicular runners can be deposited so that all runners are deposited with the wafer anisotropy perpendicular to the length of the runner, so that each runner's sensitivity is maximized. Also, process limitations on runner spacing can be overcome by placing runners in multiple layers in order to improve the sensitivity. Runners on all layers would not necessarily need to be electrically connected to achieve this benefit.

BRIEF DESCRIPTION OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the principles of the disclosed embodiments.

DETAILED DESCRIPTION

The particular values and configurations discussed in these non-limiting examples can be varied and are cited merely to illustrate at least one embodiment and are not intended to limit the scope of the invention.

Figure 1:
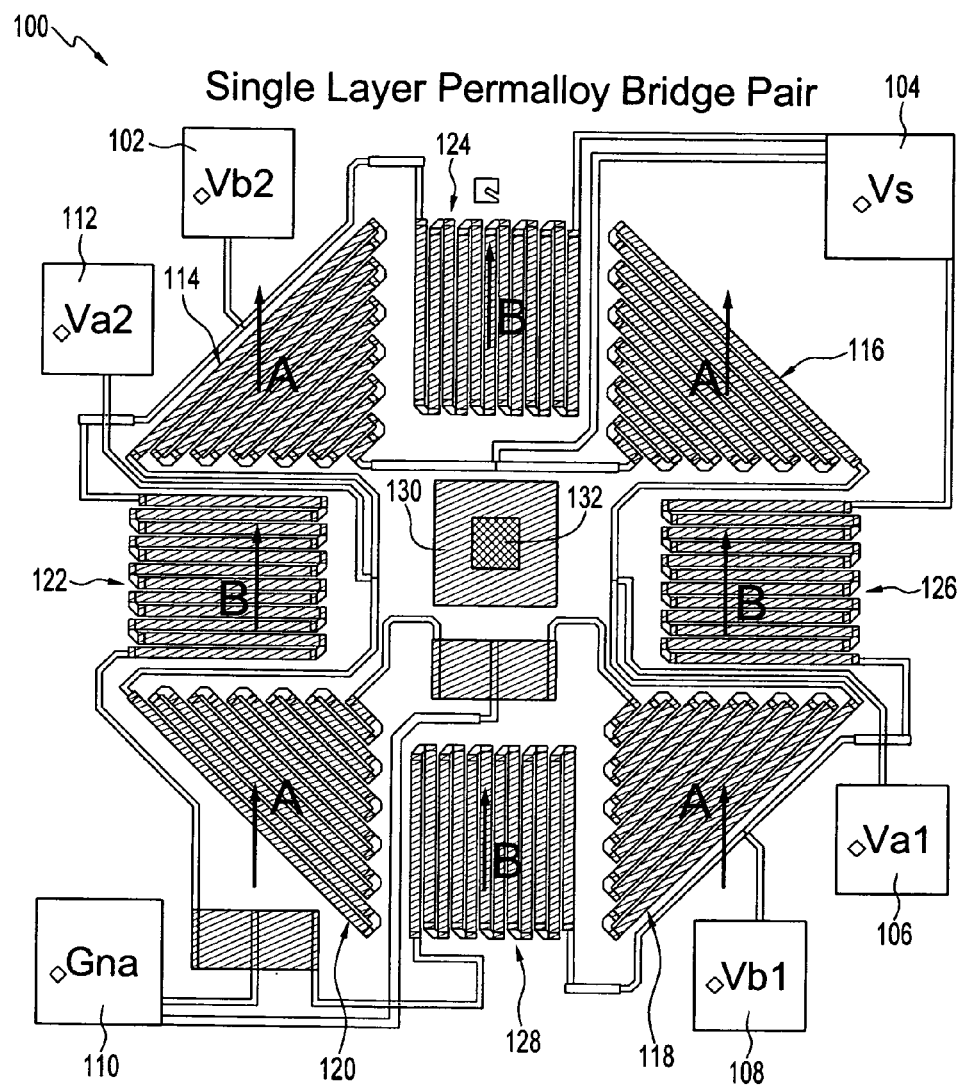
FIG. 1 illustrates a schematic diagram of a bridge circuit formed from a single layer permalloy bridge pair.

FIG. 1 illustrates a schematic diagram of a bridge circuit 100 formed from a single layer permalloy bridge pair. Circuit 100 generally includes a circuit bridge A composed of bridge elements 114, 116, 118, and 120, and a circuit bridge B composed of bridge elements 122, 124, 126, and 128. The bridge circuit 100 is connected to a ground pad 110 and voltage pads 112, 102, 104, 106, and 108. Note that a magnet may be located centrally within or proximate to circuit 100. Markers 130 and 132 can be provided as laser alignment markers for offset trimming in the center of circuit 100 with respect or next to the ground pad 110. Although not specifically shown in FIG. 1, it can be appreciated that a magnet can be disposed centrally with respect to bridge circuit 100 and in the same general area as indicated by the laser alignment markers 130, 132.

In the single layer permalloy bridge pair configuration depicted in FIG. 1, the same wafer anisotropy is available for all bridge elements 114, 116, 118, 120 and 122, 124, 126, 128. Note that each of the bridge elements 114, 116, 118, 120 and 122, 124, 126, 128 are made of individual permalloy runners.

Figure 2:
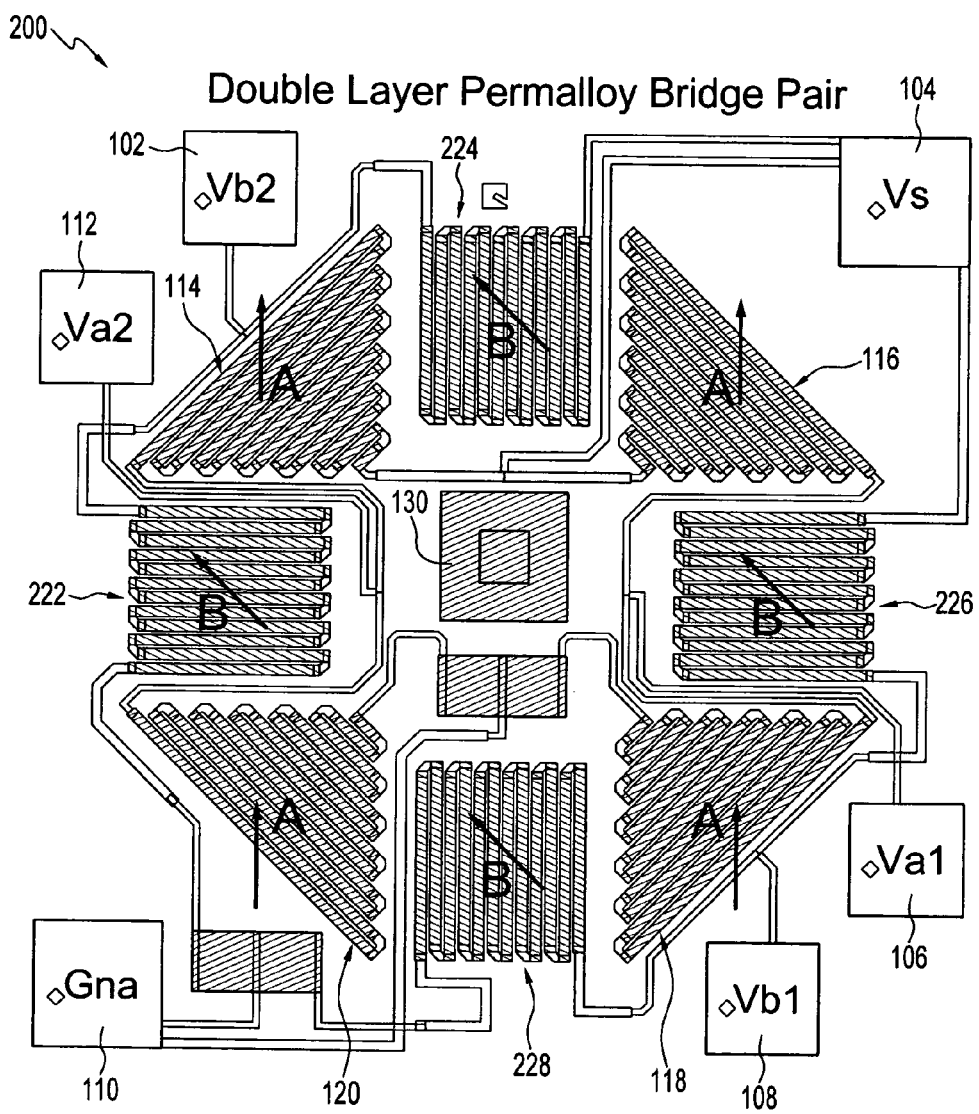
FIG. 2 illustrates a schematic diagram of a bridge circuit formed from a double layer permalloy bridge pair, in accordance with a preferred embodiment.

FIG. 2 illustrates a schematic diagram of a bridge circuit 200 formed from a double layer permalloy bridge pair, in accordance with a preferred embodiment. Note that in FIGS. 1-2, identical or similar parts or elements are generally indicated by identical reference numerals. The double layer permalloy bridge pair configuration depicted in FIG. 2 is presented as a contrast to the single layer permalloy bridge pair depicted in FIG. 1. The configuration depicted in FIG. 2, generally includes the same elements shown in FIG. 1, except for the replacement of the bridge elements 122, 124, 126, 128 of FIG. 1 with the bridge elements 222, 224, 226, and 228 of FIG. 2. By doing so, concentric bridges A and B can configured on separate permalloy layers and are made more symmetrical by controlling the wafer anisotropy direction for each layer. In the configuration depicted in FIG. 2, wafer Anisotropy can be controlled independently by putting bridges on separate permalloy layers.

In general, by making permalloy bridge runners wider, the runner is made magnetically "softer", which makes it more sensitive at lower fields. However, this lowers the resistance of the runner which either increases the current consumption of the sensor, or requires the runner to be longer and consume more circuit area. Depositing the permalloy perpendicular to the runner's shape also makes the runner more sensitive at low fields. However, this is not always possible if the bridge contains runners that are perpendicular. If the bridge contains runners in two perpendicular axis, depositing a single layer of permalloy at a 45 degree angle can reduce magnetic offsets and hysteresis effects by making the runners symmetrical. It has also been shown that the sensitivity can be improved similar to magnetic flux concentration by placing runners closer together and that this is not caused by the interaction of electrical current flowing through the runner. Note that although a 45 degree angle is discussed herein for illustrative purposes only, it can be appreciated that other angles are possible in accordance with other embodiments. The embodiments are, of course, not limited to the use of a 45 degree angle as discussed above.

By constructing bridges in two or more layers of permalloy, such as provided by the configuration of FIG. 2, these improvements can be further utilized. Bridges with perpendicular runners can be deposited so that all runners are deposited with the wafer anisotropy perpendicular to the length of the runner, so that each runner's sensitivity can be maximized. Also, process limitations on runner spacing can be overcome by placing runners in multiple layers in order to improve the sensitivity. Runners on all layers would not necessarily have to be electrically connected to achieve the benefit.

Concentric bridges each containing perpendicular runner elements can be further optimized by selecting the wafer anisotropies for each layer of permalloy runners. In this way, all runners can possess a wafer anisotropy at, for example, but not limited to, a 45 degree angle to the runner providing better matching between the two bridges.

Figure 3:
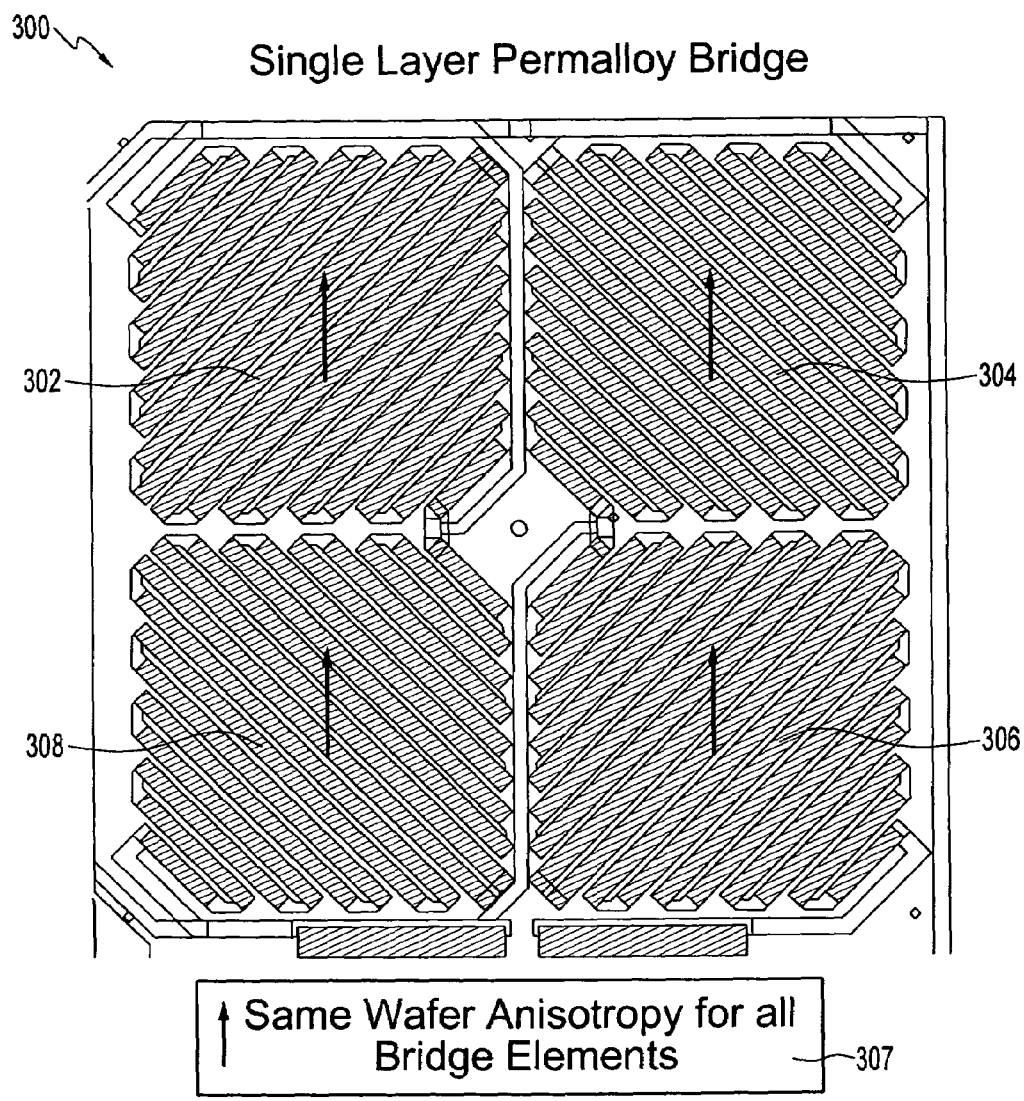
FIG. 3 illustrates a schematic diagram of a single layer Wheatstone permalloy bridge configuration.
Figure 4:
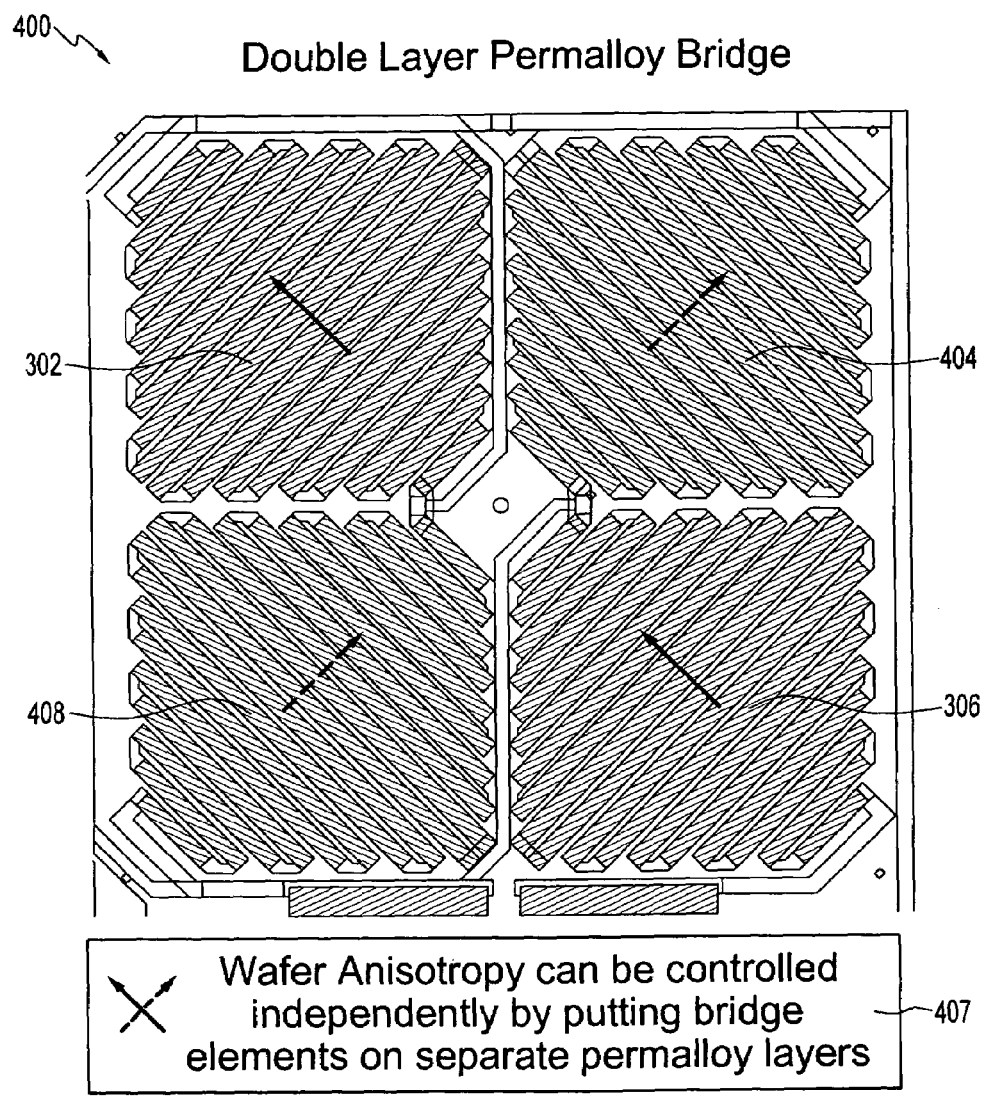
FIG. 4 illustrates a schematic diagram of a double layer Wheatstone bridge permalloy bridge configuration in accordance with an alternative embodiment

FIG. 3 illustrates a schematic diagram of a single layer Wheatstone permalloy bridge configuration 300. FIG. 4 illustrates a schematic diagram of a double layer Wheatstone bridge permalloy bridge configuration 400, in accordance with an alternative embodiment. Note that in FIGS. 3-4, identical or similar parts or elements are generally indicated by identical reference numerals. FIGS. 3-4 are provided for comparison purposes; that is to compare the single layer permalloy bridge 300 to the double layer permalloy bridge 400. Bridge 300 generally includes permalloy bridge elements 302, 304, 306, and 308, while bridge 400 includes permalloy bridge elements 302, 404, 306, and 408. In the configuration of bridge 300, the same wafer anisotropy applies for all bridge elements 302, 304, 306, and 308 as indicated at block 307. In bridge 400, the wafer anisotropy can be controlled independently by putting bridge elements on separate permalloy layers as indicated at block 407. FIGS. 3-4 thus demonstrate that bridges made on separate permalloy layers can be made more sensitive by controlling wafer anisotropy direction for independent bridge elements.

It will be appreciated that variations of the above-disclosed and other features and functions, or alternatives thereof, may be desirably combined into many other different systems or applications. Also that various presently unforeseen or unanticipated alternatives, modifications, variations or improvements therein may be subsequently made by those skilled in the art which are also intended to be encompassed by the following claims.

What is claimed is:

1. A magnetic sensing method, comprising:
   providing a plurality of bridge circuits, wherein each bridge circuit among said plurality of bridge circuits is formed on a separate permalloy layer comprising a plurality of permalloy bridge runners; and selecting said plurality of permalloy bridge runners such that each permalloy bridge runner among said plurality of permalloy bridge runners possesses a wafer anisotropy perpendicular to a length of said permalloy bridge runner and wherein all permalloy bridge runners among said plurality of permalloy bridge runners possess said wafer anisotropy at a 45-degree angle to provide enhanced matching capabilities between said plurality of bridge circuits in order to form a magnetic sensor based on said plurality of bridge circuits, maximize a magnetic sensitivity of said magnetic sensor, and independently control said wafer anisotropy through the use of multiple bridge circuits configured on separate permalloy layers.

2. The method of claim 1 wherein said plurality of bridge circuits comprises concentric bridge circuits.

3. The method of claim 1 wherein each bridge circuit among said plurality of bridge circuits comprises a Wheatstone bridge circuit.

4. The method of claim 1 further comprising configuring said separate permalloy layers to comprise at least one permalloy layer comprising at least one narrow permalloy bridge runner and at least one other permalloy layer comprising at least one non-electrically conducting permalloy bridge runner, wherein said at least one narrow permalloy bridge runner creates an electrical bridge signal with the assistance of said at least one non-electrically conducting permalloy bridge runner.

5. The method of claim 4 wherein said at least one permalloy layer is located adjacent said at least one other permalloy layer.

6. The method of claim 1 wherein said plurality of permalloy bridge runners is selected such that each permalloy bridge runner among said plurality of permalloy bridge runners possesses a wafer anisotropy that possesses any selectable angle with respect to a length of said permalloy bridge runner.

7. A magnetic sensor apparatus, comprising:
a plurality of bridge circuits, wherein each bridge circuit among said plurality of bridge circuits is formed on a separate permalloy layer comprising a plurality of permalloy bridge runners;

wherein said plurality of permalloy bridge runners is selected such that each permalloy bridge runner among said plurality of permalloy bridge runners possesses a wafer anisotropy perpendicular to a length of said permalloy bridge runner in order to form a magnetic sensor based on said plurality of bridge circuits, maximize a magnetic sensitivity of said magnetic sensor, and independently control said wafer anisotropy through the use of multiple bridge circuits configured on separate permalloy layers;

wherein all permalloy bridge runners among said plurality of permalloy bridge runners possess said wafer anisotropy at a 45-degree angle to the runner length to provide enhanced matching capabilities between said plurality of bridge circuits; and wherein said at least one narrow permalloy bridge runner limits an amount of current consumption of said magnetic sensor, and wherein a presence of said at least one non-electrically conducting permalloy bridge runner assists in making said at least one narrow permalloy bridge runner magnetically more sensitive than without a presence of said at least one non-electrically conducting permalloy bridge runner.

8. The apparatus of claim 7 wherein said plurality of bridge circuits comprises concentric bridge circuits.

9. The apparatus of claim 7 wherein each bridge circuit among said plurality of bridge circuits comprises a Wheatstone bridge circuit.

10. The apparatus of claim 9 where said at least one permalloy layer is located adjacent said at least one other permalloy layer.

11. The apparatus of claim 9 wherein said at least one narrow permalloy bridge runner limits an amount of current consumption of said magnetic sensor, and wherein a presence of said at least one non-electrically conducting permalloy bridge runner assists in making said at least one narrow permalloy bridge runner magnetically more sensitive than without a presence of said at least one non-electrically conducting permalloy bridge runner.

12. A magnetic sensor, comprising:
a plurality of concentric bridge circuits, wherein each bridge circuit among said plurality of concentric bridge circuits is formed on a separate permalloy layer comprising a plurality of permalloy bridge runners;

wherein said plurality of permalloy bridge runners is selected such that each permalloy bridge runner among said plurality of permalloy bridge runners possesses a wafer anisotropy perpendicular to a length of said permalloy bridge runner; and wherein all permalloy bridge runners among said plurality of permalloy bridge runners possess said wafer anisotropy at a 45-degree angle to provide enhanced matching capabilities between said plurality of concentric bridge circuits in order to form a magnetic sensor based on said plurality of concentric bridge circuits, maximize a magnetic sensitivity of said magnetic sensor, and independently control said wafer anisotropy through the use of multiple bridge circuits configured on separate permalloy layers.

13. The sensor of claim 12 wherein said at least one permalloy layer is located adjacent said at least one other permalloy layer.

14. The sensor of claim 12 wherein said at least one narrow permalloy bridge runner limits an amount of current consumption of said magnetic sensor, and wherein a presence of said at least one non-electrically conducting permalloy bridge runner assists in making said at least one narrow permalloy bridge runner magnetically more sensitive than without a presence of said at least one non-electrically conducting permalloy bridge runner.

15. The sensor of claim 12 wherein each bridge circuit among said plurality of concentric bridge circuits comprises a Wheatstone bridge circuit.

16. The sensor of claim 12 wherein said plurality of concentric bridge circuits comprises two concentric bridge circuits.

17. The sensor of claim 12 wherein:
said at least one permalloy layer is located adjacent said at least one other permalloy layer; and
each bridge circuit among said plurality of concentric bridge circuits comprises a Wheatstone bridge circuit.

18. The sensor of claim 12 wherein:
said plurality of concentric bridge circuits comprises two concentric bridge circuits and wherein said at least one narrow permalloy bridge runner limits an amount of current consumption of said magnetic sensor; and
a presence of said at least one non-electrically conducting permalloy bridge runner assists in making said at least one narrow permalloy bridge runner magnetically more sensitive than without a presence of said at least one non-electrically conducting permalloy bridge runner.

19. The sensor of claim 12 wherein:

said at least one permalloy layer is located adjacent said at least one other permalloy layer;

said at least one narrow permalloy bridge runner limits an amount of current consumption of said magnetic sensor; and a presence of said at least one non-electrically conducting permalloy bridge runner assists in making said at least one narrow permalloy bridge runner magnetically more sensitive than without a presence of said at least one non-electrically conducting permalloy bridge runner.

20. The sensor of claim 12 wherein:

said at least one permalloy layer is located adjacent said at least one other permalloy layer;

said at least one narrow permalloy bridge runner limits an amount of current consumption of said magnetic sensor, and wherein a presence of said at least one non-electrically conducting permalloy bridge runner assists in making said at least one narrow permalloy bridge runner magnetically more sensitive than without a presence of said at least one non-electrically conducting permalloy bridge runner;

each bridge circuit among said plurality of concentric bridge circuits comprises a Wheatstone bridge circuit; and said plurality of concentric bridge circuits comprises two concentric bridge circuits.

* * * * *